United States Patent
Lee (10) Patent No.: US 11,005,259 B2
(45) Date of Patent: May 11, 2021

(54) MONITORING AND LOAD CONTROLLING SYSTEM FOR SWITCHBOARD

(71) Applicant: LS ELECTRIC CO., LTD., Anyang-si (KR)

(72) Inventor: Seong-Joon Lee, Anyang-si (KR)

(73) Assignee: LS ELECTRIC CO., LTD., Anyang-si (KR)

( * ) Notice: Subject to any disclaimer, the term of this patent is extended or adjusted under 35 U.S.C. 154(b) by 0 days.

(21) Appl. No.: 16/959,568

(22) PCT Filed: Dec. 19, 2018

(86) PCT No.: PCT/KR2018/016214
§ 371 (c)(1),
(2) Date: Jul. 1, 2020

(87) PCT Pub. No.: WO2019/156343
PCT Pub. Date: Aug. 15, 2019

(65) Prior Publication Data
US 2020/0389013 A1    Dec. 10, 2020

(30) Foreign Application Priority Data
Feb. 7, 2018   (KR) .................. 10-2018-0015168

(51) Int. Cl.
*H02H 7/22* (2006.01)
*G01K 1/02* (2021.01)
(Continued)

(52) U.S. Cl.
CPC .............. *H02H 7/222* (2013.01); *G01K 1/026* (2013.01); *G01R 19/0092* (2013.01); *H02H 1/0007* (2013.01)

(58) Field of Classification Search
CPC ...... H02H 7/222; H02H 1/0007; G01K 1/026; G01R 19/0092
(Continued)

(56) References Cited

FOREIGN PATENT DOCUMENTS

| EP | 0688080 A1 | 12/1995 |
|---|---|---|
| JP | 2005304148 A | 10/2005 |

(Continued)

OTHER PUBLICATIONS

International Search Report for related International Application No. PCT/KR2018/016214; report dated Aug. 15, 2019; (5 pages).
(Continued)

*Primary Examiner* — Dharti H Patel
(74) *Attorney, Agent, or Firm* — K&L Gates LLP (57) ABSTRACT

A monitoring and load controlling system for a switchboard, according to one embodiment of the present specification, comprises: a gateway which acquires respective temperature information of circuit breakers included in a switchboard, and respective current amount information of lines corresponding to the circuit breakers, acquires respective capacity information of the circuit breakers on the basis of the acquired temperature information, and, on the basis of the acquired capacity information and current amount information, detects a circuit breaker corresponding to a line in need of load regulation; and a load controlling device which regulates the load of said line by stopping the operation of at least one device among devices connected to the detected circuit breaker.

13 Claims, 7 Drawing Sheets

(51) Int. Cl.
*G01R 19/00* (2006.01)
*H02H 1/00* (2006.01)

(58) Field of Classification Search
USPC .......................................................... 361/103
See application file for complete search history.

(56) References Cited

FOREIGN PATENT DOCUMENTS

| | | | |
|---|---|---|---|
| KR | 1020050080950 | A | 8/2005 |
| KR | 10-0669157 | B1 | 1/2007 |
| KR | 20090020219 | A | 2/2009 |
| KR | 100887550 | B1 | 3/2009 |
| KR | 20090085920 | A | 8/2009 |
| KR | 20140030740 | A | 3/2014 |
| KR | 20140061102 | A | 5/2014 |
| KR | 101609589 | B1 | 4/2016 |

OTHER PUBLICATIONS

Written Opinion for related International Application No. PCT/KR2018/016214; report dated Aug. 15, 2019; (3 pages).
Extended European Search Report for related European Application No. 18905587.4; dated Apr. 1, 2021; (5 pages).

MONITORING AND LOAD CONTROLLING SYSTEM FOR SWITCHBOARD

CROSS-REFERENCE TO RELATED APPLICATIONS

This application is the National Stage filing under 35 U.S.C. 371 of International Application No. PCT/KR2018/016214, filed on Dec. 19, 2018, which claims the benefit of earlier filing date and right of priority to Korean Application No. 10-2018-0015168, filed on Feb. 7, 2018, the contents of which are all hereby incorporated by reference herein in their entirety.

FIELD OF THE INVENTION

The present disclosure relates to a switchboard-monitoring and load-controlling system that monitors a state of a circuit breaker provided in a switchboard and controls a load based on the monitored state.

BACKGROUND OF THE INVENTION

A number of power related components for power conversion, transmission, and measurement are arranged in a switchboard. Among these components, a circuit breaker disposed at an electrical line along which power is transmitted cuts off the electrical line when overcurrent, overvoltage, undervoltage, short circuit, ground fault, etc. are detected at the electrical line, thereby to protect the switchboard and loads or various systems connected thereto.

For example, when a current amount of the electrical line exceeds a capacity of the circuit breaker, the circuit breaker may cut off the electrical line. When the electrical line is cut off, supply of the power to apparatuses connected to the corresponding electrical line is disabled, so that the apparatuses are turned off.

Some apparatus may have no problem even when the power supply thereto is suddenly cut off. However, certain apparatuses may have failure of or damage to internal circuits or components therein due to the sudden cut off. In particular, when the apparatus connected to the electrical line is a data processing device such as a PC or a server, there is a risk of data loss. Further, certain apparatuses need to maintain the power supply thereto as continuously as possible (For example, a refrigeration cycle apparatus in a refrigeration warehouse needs to maintain the power supply thereto as continuously as possible).

Therefore, it is necessary to properly adjust a current amount flowing in the electrical line so that the cut off operation of the circuit breaker is minimized.

BRIEF SUMMARY OF THE INVENTION

A purpose of the present disclosure is to provide a switchboard-monitoring and load-controlling system capable of controlling a load based on states of a circuit breaker and an electrical line disposed in a switchboard, thereby minimizing a cut-off operation of the electrical line by the circuit breaker.

An aspect of the present disclosure provides a system for monitoring a switchboard and controlling a load, the system comprising: a gateway configured to: acquire temperature information of each of circuit breakers included in the switchboard, and current amount information of each of electrical lines corresponding to the circuit breakers; acquire capacity information of each of the circuit breakers based on the acquired temperature information; and detect a circuit breaker corresponding to an electrical line requiring adjustment of a load thereof, based on the acquired capacity information and current amount information; and a load control device configured to stop an operation of at least one apparatus among apparatuses connected to the detected circuit breaker, thereby to adjust the load of the electrical line corresponding to the detected circuit breaker.

In one embodiment, the system further comprises a temperature sensor for acquiring data for acquiring temperature information of each of the circuit breakers included in the switchboard, wherein the gateway is configured to receive the data from the temperature sensor, and acquire the temperature information of each of the circuit breakers based on the received data.

In one embodiment, the temperature sensor includes a thermal image sensor to acquire thermal image data for each of the circuit breakers.

In one embodiment, the gateway is configured to receive the current amount information of each of the electrical lines corresponding to the circuit breakers from measuring units corresponding to the circuit breakers, respectively.

In one embodiment, the gateway has a memory, wherein circuit breaker temperature-capacity information including capacity information corresponding to temperature information of each of the circuit breakers is stored in the memory, wherein the gateway is configured to acquire the capacity information corresponding to the acquired temperature information, from the stored circuit breaker temperature-capacity information.

In one embodiment, the gateway is configured to: detect a specific circuit breaker among the circuit breakers, wherein a current amount of an electrical line corresponding to the specific circuit breaker is greater than or equal to the acquired capacity; and transmit a load adjustment request to the load control device, wherein the load adjustment request includes identification information of the detected circuit breaker, the acquired capacity information thereof, and the current amount information of the electrical line corresponding to the detected circuit breaker.

In one embodiment, the gateway is configured to: detect a specific circuit breaker among the circuit breakers, wherein a difference between the acquired capacity of the specific circuit breaker and the current amount of the electrical line corresponding thereto is smaller than a reference value; and transmit a load adjustment request to the load control device, wherein the load adjustment request includes identification information of the detected circuit breaker, the acquired capacity information thereof, and the current amount information of the electrical line corresponding to the detected circuit breaker.

In one embodiment, the load control device is configured to transmit a control signal indicating the stop of the operation to the at least one apparatus, based on priority information of the apparatuses connected to the detected circuit breaker, and power consumption information of each of the connected apparatuses.

Another aspect of the present disclosure provides a system for monitoring a switchboard and controlling a load, the system comprising: a temperature sensor for acquiring data for acquisition of temperature information of each of circuit breakers included in the switchboard; a gateway configured to: receive the data from the temperature sensor; and receive current amount information of each of electrical lines corresponding to the circuit breakers from each of measuring units corresponding to the circuit breakers; and a load control device configured to: receive the data and the current amount information from the gateway; acquire temperature information of each of the circuit breakers based on the received data; acquire capacity information of each of the circuit breakers based on the acquired temperature information; detect a circuit breaker corresponding to an electrical line requiring adjustment of a load thereof, based on the acquired capacity information and current amount information; and stop an operation of at least one apparatus among apparatuses connected to the detected circuit breaker, thereby to adjust the load of the electrical line corresponding to the detected circuit breaker.

According to various embodiments of the present disclosure, the switchboard-monitoring and load-controlling system may adjust the load based on the capacity varying according to the temperature of the circuit breaker, thereby to prevent unexpected cut-off of the electrical line.

Further, according to the present disclosure, the switchboard-monitoring and load-controlling system may stop operations of only some of the apparatuses based on the priority, thereby to effectively prevent unexpected stop of an operation of an apparatus having high importance or requiring continuous operation. Accordingly, an operator or a user may effectively manage the apparatuses existing in buildings or facilities via the switchboard-monitoring and load-controlling system.

DETAILED DESCRIPTION OF THE INVENTION

Hereinafter, exemplary embodiments disclosed in the present disclosure will be illustrated in detail with reference to the accompanying drawings. The same or similar elements will be assigned the same reference numbers throughout the accompanying drawings. Overlapping descriptions between the exemplary embodiments will be omitted. As used herein, a suffix "module" or "unit" as used for a component are intended only for ease of writing the present disclosure, and the suffix "module" or "unit" itself does not have a specific meaning or role. Further, in describing the embodiments disclosed in the present disclosure, detailed descriptions of well-known components are omitted when it is determined that the detailed descriptions of the well-known components obscure gist of the embodiments disclosed in the present disclosure. Further, it should be understood that the attached drawings are set forth only for easy understanding of the embodiments disclosed in the present disclosure, and a technical spirit disclosed in the present disclosure is not limited to the attached drawings, and all changes, equivalents, or substitutes to or with the embodiments disclosed in the present disclosure are included in the scope of the present disclosure.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

As used herein, the singular forms "a" and "an" are intended to include the plural forms as well, unless the context clearly indicates otherwise.

It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof.

Hereinafter, exemplary embodiments of the present disclosure will be described in detail with reference to the accompanying drawings in the present disclosure.

Figure 1:
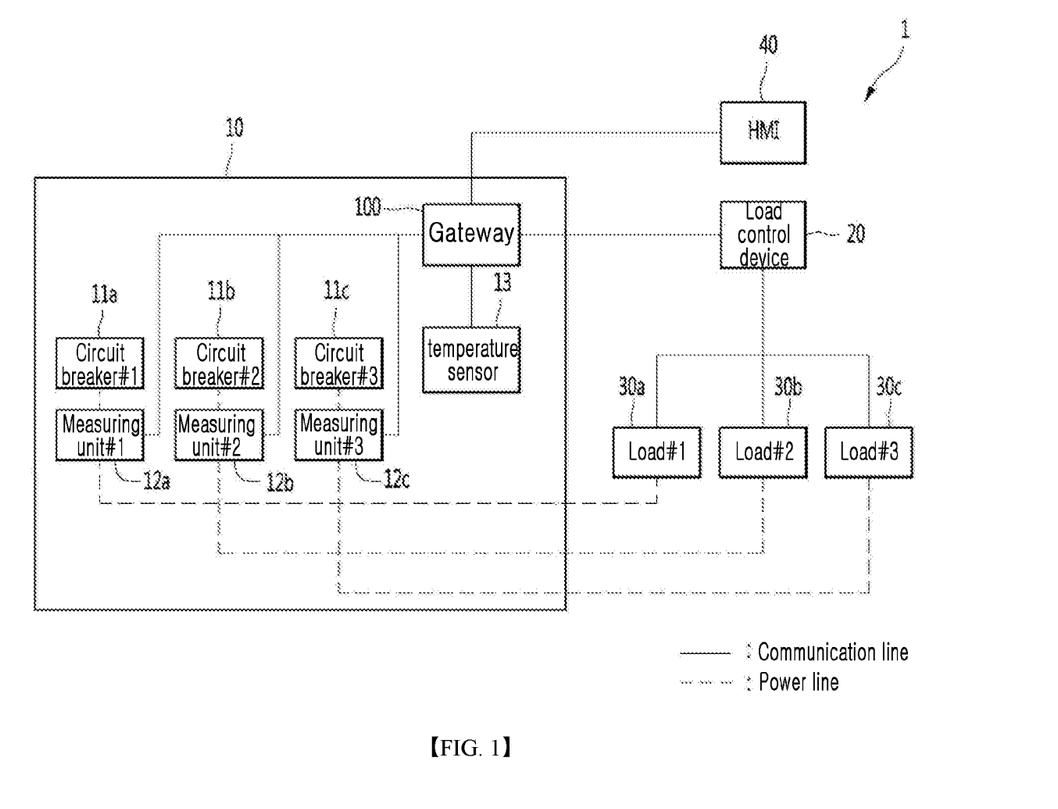
FIG. 1 is a schematic block diagram for illustrating a switchboard-monitoring and load-controlling system according to an embodiment of the present disclosure.

FIG. 1 is a schematic block diagram for illustrating a switchboard-monitoring and load-controlling system according to an embodiment of the present disclosure.

FIG. 1 shows only three circuit breakers, three measuring units, and three loads, respectively, for convenience of illustration. However, the number of the circuit breakers, the number of the measuring units, and the number of the loads may vary.

Referring to FIG. 1, a switchboard-monitoring and load-controlling system 1 may include a gateway 100, a load control device 20, and a temperature sensor 13.

The gateway 100 and the temperature sensor 13 may be disposed in a switchboard panel 10. According to an embodiment, the gateway 100 may be disposed outside the switchboard panel 10.

The gateway 100 may be connected to the measuring units 12a, 12b, and 12c in the switchboard panel 10 and thus communicate therewith. The gateway 100 may periodically or aperiodically acquire information such as a current amount and a voltage of each electrical line at which each of the measuring units 12a, 12b, and 12c is disposed. For example, when each of the measuring units 12a, 12b, and 12c acts as a current measuring unit, the gateway 100 may acquire current amount information of each of the electrical lines.

According to an embodiment, the gateway 100 may be connected to the circuit breakers 11a, 11b, and 11c and may communication therewith to acquire various information related to an operation of each of the circuit breakers. For example, each of the circuit breakers 11a, 11b, and 11c may be implemented as an ACB (air circuit breaker), a MCCB (molded case circuit breaker), a MCB (molded circuit breaker), or the like.

The gateway 100 may process the acquired information to generate data. Then, the gateway 100 may transmit the acquired information or the generated data to the load control device 20.

The temperature sensor 13 may measure a temperature of each of the circuit breakers 11a, 11b, and 11c disposed in the switchboard panel 10. For example, the temperature sensor 13 may be implemented as a thermal image sensor including a thermal image camera that acquires thermal image data (thermal image) of each of the circuit breakers 11a, 11b, and 11c. The thermal image sensor may be connected to the gateway 100 and thus may transmit the acquired thermal image data to the gateway 10. According to an embodiment, the temperature sensor 13 may include a temperature sensor that contacts or is received in each of the circuit breakers 11a to 11c. In this case, each of the temperature sensors may transmit the sensed temperature information to the gateway 100.

Each of the loads 30a, 30b, and 30c may include at least one apparatus that receives power from the switchboard for operation thereof.

The load control device 20 may be connected to apparatuses included in the loads 30a, 30b, and 30c and may receive various information related to operations of the apparatuses or to control the operations of the apparatuses.

For example, the load control device 20 may be embodied as various management servers or management devices such as a building management system (BMS), a facility management system (FMS), etc. However, the present disclosure is not limited thereto.

According to an embodiment, the switchboard-monitoring and load-controlling system 1 may further include an HMI (human machine interface) 40. The HMI 40 may receive various information related to an operation status in the switchboard panel 10 from the gateway 100 and display the information in a graphic or text form. Further, the HMI 40 may receive various commands or requests related to an operation of the switchboard from the operator or the user, and transmit the received commands or requests to the gateway 100.

In one example, when the current amount flowing in each of the electrical lines exceeds each predetermined value, each of the circuit breakers 11a, 11 b, and 11c may cut off each of the electrical lines. Each predetermined value may correspond to each circuit breaker capacity. Further, each circuit breaker capacity may vary according to a temperature of each of the circuit breakers 11a, 11b, and 11c.

For example, when the temperature of each of the circuit breaker rises up, the capacity of each of the circuit breakers may be reduced. Thus, when apparatuses corresponding to a specific load, for example, the first load 30a connected to a specific electrical line, for example, the first electrical line operate for a long time, the electric current is supplied to the first load for a long time through the first electrical line. Accordingly, the temperature of the circuit breaker connected thereto, for example, the first circuit breaker 11a may gradually increase. As the temperature of the first circuit breaker 11a gradually increases, the capacity of the first circuit breaker 11a may decrease, and thus the capacity thereof may be lower than a current amount of the first electrical line. Accordingly, the first circuit breaker 11a may cut off the first electrical line. Thus, the apparatuses included in the first load 30a connected to the first electrical line may not be able to operate. In this case, some of the apparatuses included in the first load 30a may fail to operate even though they must be continuously operated.

Embodiments related to an operation of the switchboard-monitoring and load-controlling system to solve the above problem will be illustrated with reference to FIG. 2 to FIG. 7.

First, referring to FIG. 2 and FIG. 3, the gateway and the load control device included in the switchboard-monitoring and load-controlling system according to an embodiment of the present disclosure will be described in more detail.

Figure 2:
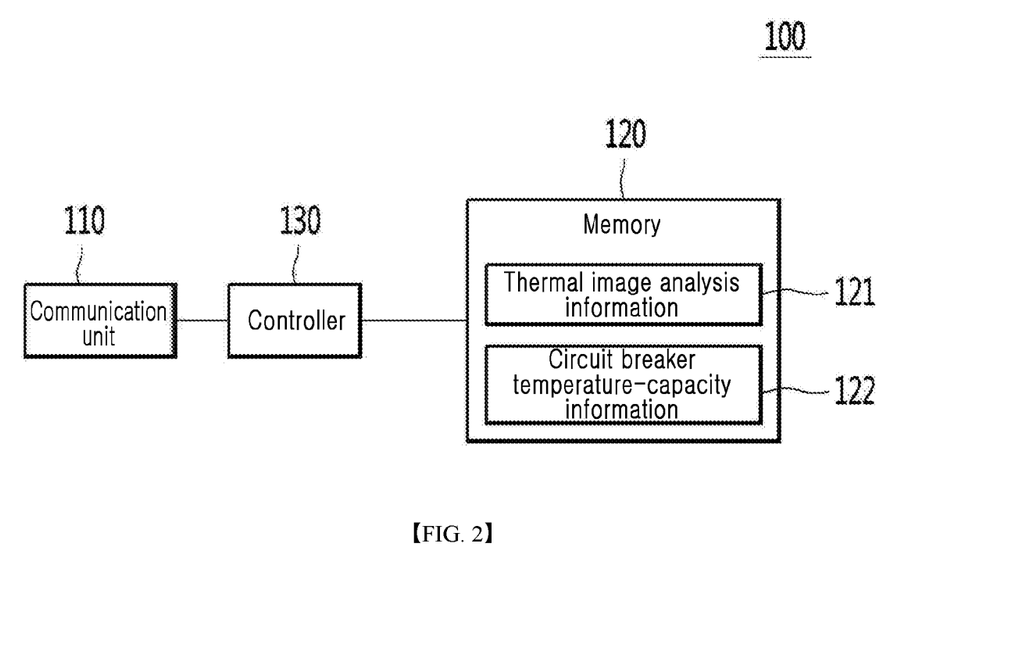
FIG. 2 is a schematic block diagram of a gateway disposed in a switchboard according to an embodiment of the present disclosure.

FIG. 2 is a schematic block diagram of the gateway disposed in the switchboard according to an embodiment of the present disclosure.

Referring to FIG. 2, the gateway 100 may include a communication unit 110, a memory 120, and a controller 130. In FIG. 2, for convenience of illustration, only some of the components of the gateway 100 are illustrated. However, the gateway 100 may include more components.

The communication unit 110 may connect the gateway 100 with the measuring units 12a, 12b, and 12c, the temperature sensor 13, the load control device 20, and the HMI 40 to enable transmission and reception of information or data with those components. The communication unit 110 may support at least one of wired communication protocols such as RS485, USB, and Ethernet, and wireless communication protocols such as Bluetooth, Zigbee, and Wi-Fi.

The memory 120 may store therein various information related to an operation of gateway 100.

According to an embodiment of the present disclosure, the memory 120 may store therein thermal image analysis information 121 which may analyze the thermal image data received from the temperature sensor 13 to acquire temperature information of each of the circuit breakers 11a, 11b, and 11c. In this connection, the thermal image analysis information 121 may be embodied as an algorithm for acquiring temperature information of each of the circuit breakers 11a, 11b, and 11c based on the thermal image data.

Further, the memory 120 may further store therein circuit breaker temperature-capacity information 122 for acquiring circuit breaker capacity information based on the temperature information of each of the circuit breakers 11a, 11b, and 11c. The circuit breaker temperature-capacity information 122 may be embodied as a table including capacity information corresponding to a temperature of each of the circuit breakers 11a, 11b, and 11c.

The controller 130 may control an overall operation of the gateway 100. In particular, the controller 130 may analyze the thermal image data received through the communication unit 110 based on the thermal image analysis information 121 stored in the memory 120 to acquire the temperature information of each of the circuit breakers 11a, 11b, and 11c.

Further, the controller 130 may acquire the capacity information of each of the circuit breakers 11a, 11b, and 11c from the circuit breaker temperature-capacity information 122 stored in the memory 120, based on the acquired temperature information of each of the circuit breakers 11a, 11b, and 11c.

The controller 130 may detect a circuit breaker corresponding to an electrical line corresponding to a load to be controlled, based on the capacity information of each of the circuit breakers 11a, 11b, and 11c and the current amount information acquired from each of the measuring units 12a, 12b, and 12c. The controller 130 may transmit information (identification information) of the detected circuit breaker, the acquired capacity information thereof, and current amount information corresponding thereto to the load control device 20.

Figure 3:
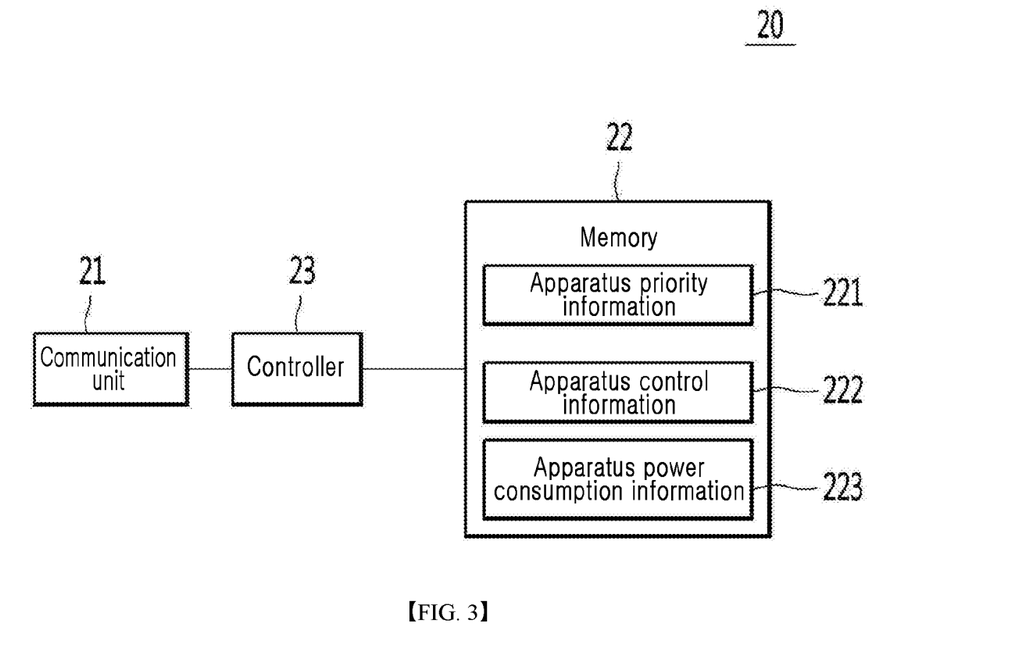
FIG. 3 is a schematic block diagram of a load control device according to an embodiment of the present disclosure.

The controller 130 may be implemented using at least one of ASICs (application specific integrated circuits), DSPs (digital signal processors), DSPDs (digital signal processing units), PLDs (programmable logic units), FPGAs (field programmable gate arrays), processors, controllers, microcontrollers, micro-processors, and electrical units for performing other functions (this may be equally applied to a controller 23 in FIG. 3).

FIG. 3 is a schematic block diagram of the load control device according to an embodiment of the present disclosure.

Referring to FIG. 3, the load control device 20 may include a communication unit 21, a memory 22, and a controller 23. In FIG. 3, for convenience of illustration, only some of the components of the load control device 20 are shown. However, the load control device 20 may include more components.

The communication unit 21 may connect the load control device 20 with the gateway 100 and the apparatuses included in the loads 30a, 30b, and 30c and may enable transmission/reception of various information or data therebetween. The communication unit 21 may support at least one of wired communication protocols such as RS485, USB, and Ethernet, and wireless communication protocols such as Bluetooth, Zigbee, and Wi-Fi.

The memory 22 may store therein various information related to an operation of the load control device 20.

In particular, according to an embodiment of the present disclosure, the memory 22 may include apparatus priority information 221.

The apparatus priority information 221 may be information about priorities between the apparatuses connected to the load control device 20. For example, an apparatus having a higher priority may be an apparatus having a higher importance (high requirement of continuous operation). The apparatus priority information 221 may be created or changed by the system administrator. However, the present disclosure is not limited thereto.

The controller 23 intends to stop operations of at least some of the apparatuses based on the information received from the gateway 100, for example, the identification information, and the capacity information of the circuit breaker detected in FIG. 3, and the current amount information of the line connected thereto. In this case, based on the apparatus priority information 221, the controller 23 may first stop an operation of an apparatus having the lowest priority.

Further, the memory 22 may further store therein apparatus control information 222 including various information or data necessary for controlling the apparatuses, and apparatus power consumption information 223 including a power consumption during an operation of each of the apparatuses. When the controller 23 intends to stop the operations of at least some of the apparatuses, the controller 23 may select at least one apparatus to be deactivated, based on the apparatus priority information 221 and the apparatus power consumption information 223 as described above.

Figure 4:
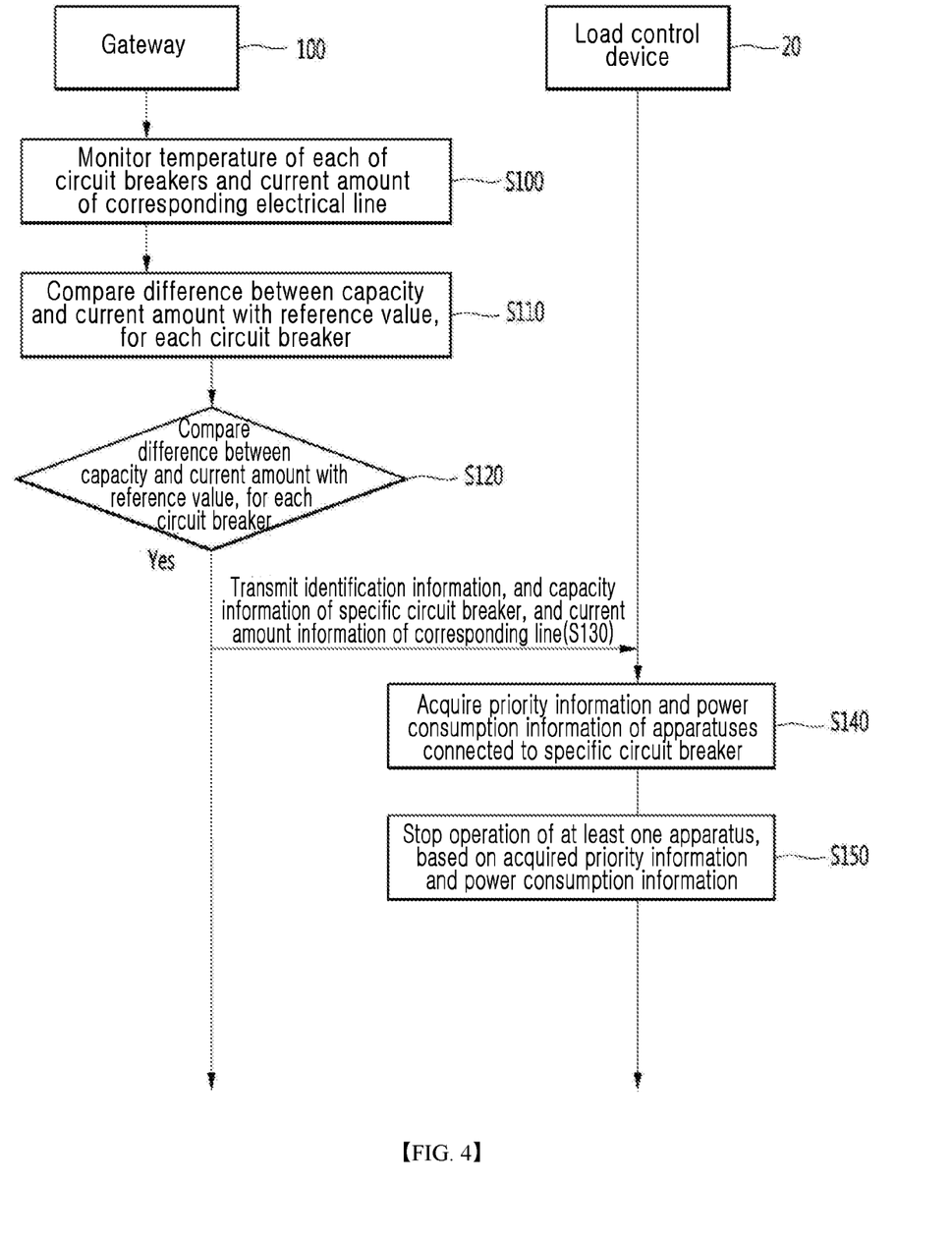
FIG. 4 is a ladder diagram for illustrating an operation of a switchboard-monitoring and load-controlling system according to an embodiment of the present disclosure.

FIG. 4 is a ladder diagram for illustrating an operation of a switchboard-monitoring and load-controlling system according to an embodiment of the present disclosure.

Referring to FIG. 4, the gateway 100 may monitor a temperature of each of the circuit breakers 11a to 11c and the current amount of the electrical line corresponding to each of the circuit breakers 11a to 11c (Operation S100).

The controller 130 of the gateway 100 may monitor the temperature of each of the circuit breakers 11a to 11c by acquiring the temperature information of each of the circuit breakers 11a to 11c, based on data acquired from the temperature sensor 13, for example, the thermal image data.

Further, the controller 130 may monitor the current amount of the electrical line corresponding to each of the circuit breakers 11a to 11c by acquiring the current amount information of each of the electrical lines from each of the measuring units 12a to 12c.

This monitoring operation may be performed periodically or whenever a specific event occurs. However, the present disclosure is not limited thereto.

The gateway 100 may acquire the capacity information of each of the circuit breakers 11a to 11c based on the monitored temperature (Operation S110).

The controller 130 may acquire the capacity information of each of the circuit breakers 11a to 11c, based on the monitored temperature from the circuit breaker temperature-capacity information 122 stored in the memory 120.

The gateway 100 may compare a difference between the capacity acquired in Operation S110 and the current amount acquired in Operation S100 with a reference value, for each of the circuit breakers 11a to 11c (Operation S120).

According to an embodiment, the gateway 100 may identify whether the acquired current amount exceeds the acquired capacity.

When, based on a result of the comparison, the difference between the capacity and the current amount is smaller than the reference value, for a specific circuit breaker (YES in Operation S120), the gateway 100 may transmit, to the load control device 20, the identification information, and the capacity information of the specific circuit breaker, and the current amount information of the line corresponding thereto (Operation S130).

Specifically, when the difference between the capacity and the current amount is smaller than the reference value, for a specific circuit breaker, the gateway 100 may transmit an adjustment request of a load connected to the specific circuit breaker to the load control device 20. The adjustment request may include identification information of the specific circuit breaker, and the capacity information thereof acquired in Operation S110, and the current amount information obtained in Operation S100 (that is, the current amount information of the electrical line corresponding to the specific circuit breaker).

The load control device 20 may acquire the priority information and the power consumption information of the apparatuses included in the load connected to the specific circuit breaker, based on the received identification information (Operation S140).

The controller 23 of the load control device 20 may acquire the priority information of the apparatuses included in the load connected to the specific circuit breaker from the apparatus priority information 221 stored in the memory 22. Further, the controller 23 may acquire the power consumption information of the apparatuses included in the load connected to the specific circuit breaker from the apparatus power consumption information 223 stored in the memory 22. In this connection, the controller 23 may acquire only priority information and power consumption information about currently operating apparatuses among the apparatuses included in the load connected to the specific circuit breaker and may not acquire priority information and power consumption information about currently non-operating apparatuses among the apparatuses included in the load connected to the specific circuit breaker.

The load control device 20 may stop an operation of at least one apparatus among the apparatuses included in the load connected to the specific circuit breaker, based on the acquired priority information and power consumption information (Operation S150).

When operations of some of the apparatuses included in the load connected to the corresponding circuit breaker are deactivated, the current amount of the electrical line corresponding to the specific circuit breaker may be reduced. That is, in order to ensure that the difference between the capacity and the current amount is greater than or equal to the reference value for the specific circuit breaker, the controller 23 may stop the operation of at least one apparatus, based on the priority information and power consumption information, such that the load connected to the specific circuit breaker may be adjusted. An example thereof will be illustrated with reference to FIG. 5 to FIG. 6.

Figure 5:
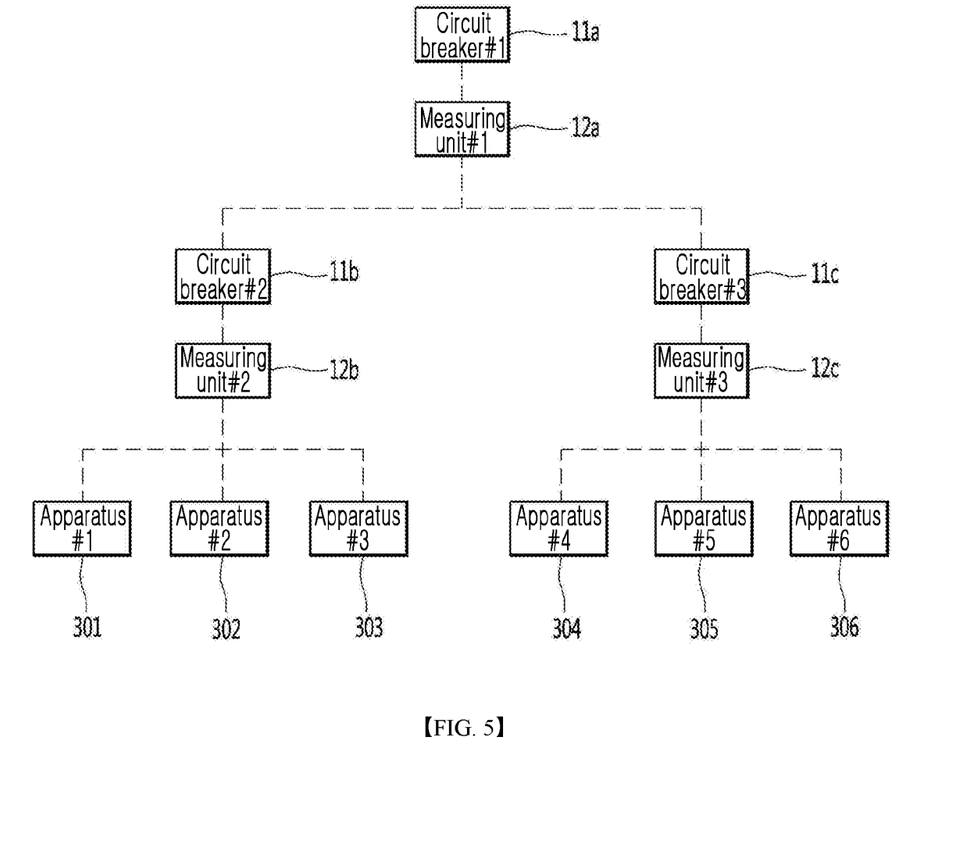
FIG. 5 and FIG. 6 are exemplary diagrams for illustrating an operation of the switchboard-monitoring and load-controlling system shown in FIG. 4.
Figure 6:
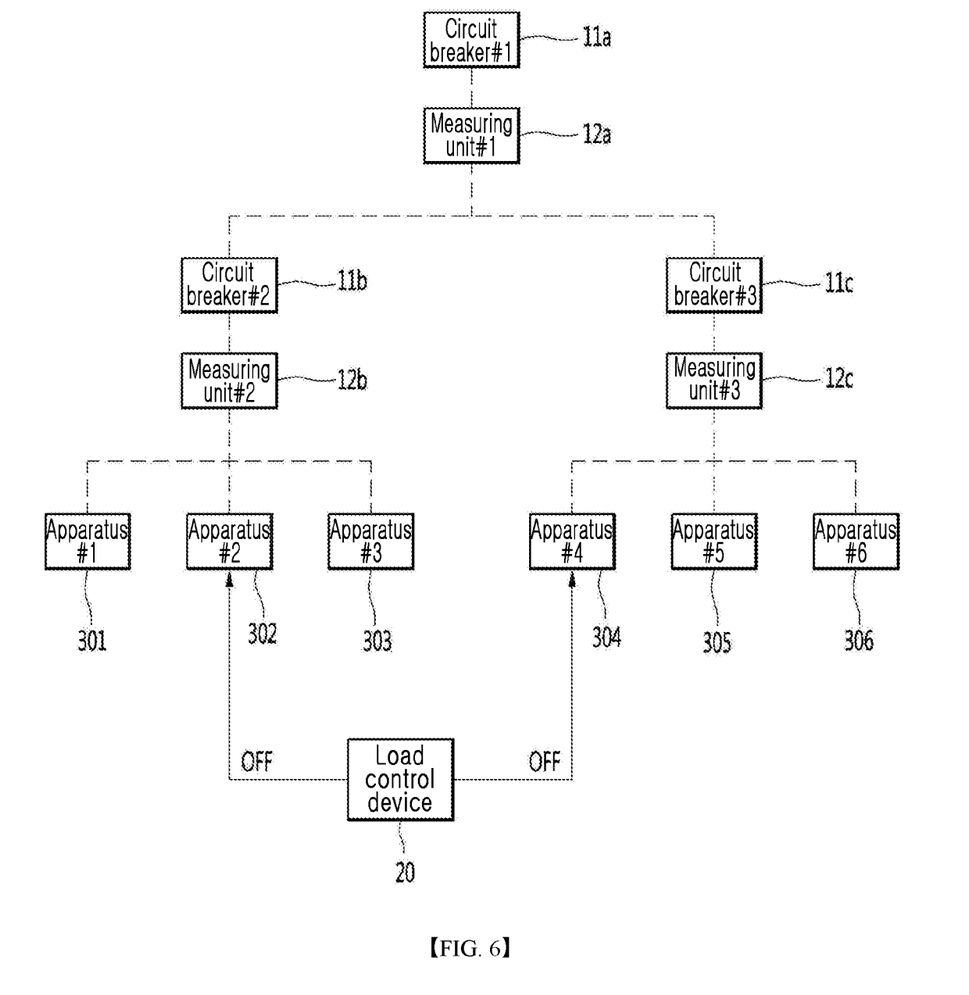

FIG. 5 and FIG. 6 are exemplary diagrams for illustrating an operation of the switchboard-monitoring and load-controlling system shown in FIG. 4.

Referring to FIG. 5 and FIG. 6, the circuit breakers 11a to 11c may be configured to include a higher circuit breaker 11a, and lower circuit breakers 11b and 11c connected to the higher circuit breaker. However, the present disclosure is not limited thereto. In this case, the higher circuit breaker 11a may be connected to a first apparatus to a sixth apparatuses 301 to 306, while the first lower circuit breaker 11b may be connected to the first apparatus to the third apparatus 301 to 303, and the second lower circuit breaker 11c may be connected to the fourth apparatus to the sixth apparatus 304 to 306. In this connection, the connection may include direct connection or indirect connection.

According to the embodiment shown in FIG. 5, current supplied to the electrical line at which the higher circuit breaker 11a is disposed may be supplied to each of the first to sixth apparatuses 301 to 306 through the electrical lines at which the lower circuit breakers 11b and 11c are disposed, respectively.

Each of the measuring units 12a, 12b, and 12c may acquire the current amount of each of the electrical lines. For example, the first measuring unit 12a may acquire the current amount of the electrical line corresponding to the higher circuit breaker 11a. The second measuring unit 12b may acquire the current amount of the electrical line corresponding to the first lower circuit breaker 11b. The third measuring unit 12c may acquire the current amount of the electrical line corresponding to the second lower circuit breaker 11c. The measuring units 12a to 12c may transmit the acquired current amount to the gateway 100. The current amount information may be acquired periodically or continuously. Alternatively, depending on an embodiment, the current amount information may be acquired whenever a specific event occurs.

Further, although not shown in the drawings, the temperature sensor 13 may transmit temperature data of each of the circuit breakers 11a to 11c to the gateway 100. For example, when the temperature sensor 13 includes a thermal image camera, the temperature sensor 13 may acquire thermal image data of each of the circuit breakers 11a to 11c and transmit the image data to the gateway 100.

The gateway 100 may measure the temperature of each of the circuit breakers 11a to 11c from the acquired thermal image data, using the thermal image analysis information 121 stored in the memory 120.

The gateway 100 may acquire the capacity information corresponding to the temperature of each of the circuit breakers 11a to 11c from the circuit breaker temperature-capacity information 122 stored in the memory 120.

Hereinafter, for convenience of illustration, it is assumed that the capacity of the higher circuit breaker 11a is 30 kA when the temperature thereof is lower than 30° C., and when the temperature thereof is 50° C. or higher, the capacity thereof is 24 kA. Further, it is assumed that an initial temperature of the higher circuit breaker 11a is 25° C. Further, it is assumed that a current temperature of the higher circuit breaker 11a as measured by the thermal image data is 50° C.

According to the above assumption, the capacity of the higher circuit breaker 11a among the capacity information acquired by the gateway 100 may correspond to 24 kA.

The gateway 100 may compare the current amount acquired from each of the measuring units 12a to 12c with the capacity of each of the circuit breakers 11a to 11c, and detect, based on the comparison result, a specific circuit breaker corresponding to a specific electrical line requiring adjustment of the current amount thereof or the load thereto.

For example, when the current amount acquired from the first measuring unit 12a is 24 kA or greater, the gateway 100 may determine an electrical line corresponding to the higher circuit breaker 11a as the electrical line requiring adjustment of the current amount thereof or the load thereto.

According to an embodiment, when the difference between the capacity of the higher circuit breaker 11a and the current amount acquired from the first measuring unit 12a is smaller than the reference value, the gateway 100 may determine an electrical line corresponding to the higher circuit breaker 11a as the electrical line requiring adjustment of the current amount thereof or the load thereto.

The gateway 100 may transmit, to the load control device 20, a load adjustment request of the electrical line requiring the adjustment of the current amount thereof or the load thereto. The load adjustment request may include identification information of higher circuit breaker 11a corresponding to the electrical line, the acquired capacity information of the higher circuit breaker 11a, and the current amount information acquired from the first measuring unit 12a corresponding to the higher circuit breaker 11a.

The load control device 20 may acquire priority information of the apparatuses 301 to 306 connected to the higher circuit breaker 11a, and power consumption information of each of the apparatuses 301 to 306 from the memory 22, based on the received load adjustment request. In this connection, the apparatuses 301 to 306 may be currently in operation.

The load control device 20 may stop an operation of at least one apparatus based on the acquired priority information and power consumption information.

For example, the load control device 20 may determine an apparatus having the lowest priority among the apparatuses 301 to 306, for example, the second apparatus 302. Then, the load control device 20 may calculate a varied current amount of a corresponding electrical line to the second apparatus 302 when an operation of the second apparatus 302 is stopped, based on the power consumption of the second apparatus 302. When the calculated varied current amount is smaller than 24 kA, the load control device 20 may transmit a control signal (OFF) for stopping the operation of the second apparatus 302 to the second apparatus 302.

To the contrary, when the calculated varied current amount is still 24 kA or greater, the load control device 20 may determine an apparatus having the second lowest priority among the apparatuses 301 to 306, for example, the fourth apparatus 304. Then, the load control device 20 may calculate a varied current amount of a corresponding electrical line to the fourth apparatus 304 when an operation of the fourth apparatus 304 is stopped, based on the power consumption of the fourth apparatus 304. When the calculated varied current amount is smaller than 24 kA, the load control device 20 may transmit a control signal (OFF) for stopping the operations of the second apparatus 302 and the fourth apparatus 304 to the second apparatus 302 and the fourth apparatus 304, respectively. The control signal OFF may be generated based on the apparatus control information 222 stored in the memory 22.

In another example, the load control device 20 may first stop the second apparatus 302 having the lowest priority among the apparatuses 301 to 306, and then may identify whether the load adjustment request of the electrical line corresponding to the higher circuit breaker 11a is received again from the gateway 100. When the load adjustment request is received again, the load control device 20 may stop the operation of the fourth apparatus 304 having the second lowest priority. That is, upon receiving the load adjustment request, the load control device 20 may repeatedly perform an operation of stopping an apparatus having the lowest priority among apparatuses currently in operation.

In a similar manner, the load control device 20 may receive a load adjustment request of an electrical line corresponding to the first lower circuit breaker 11b. In this case, the load control device 20 may stop an operation of at least one of the apparatuses 301 to 303 connected to the first lower circuit breaker 11b.

In one example, upon receiving both of the load adjustment request of the electrical line corresponding to the higher circuit breaker 11a and the load adjustment request of the electrical line corresponding to the first lower circuit breaker 11b, the load control device 20 may first process the load adjustment request of the electrical line corresponding to the first lower circuit breaker 11b. That is, the load control device 20 may stop an operation of at least one of the apparatuses 301 to 303, based on the priority of the apparatuses 301 to 303 connected to the first lower circuit breaker 11b, thereby to reduce the current amount of the electrical line corresponding to the first lower circuit breaker 11b. As a result, the current amount of the electrical line corresponding to the higher circuit breaker 11a may also be reduced. Accordingly, the operations of the apparatuses 304 to 306 connected to the second lower circuit breaker 11c may be prevented from being unnecessarily stopped. However, when the difference between the capacity of the higher circuit breaker 11a and the current amount of the electrical line corresponding to the higher circuit breaker 11a is still smaller than the reference value, the load control device 20 may stop an operation of at least one of remaining apparatuses currently in operation, based on the priority of the remaining apparatuses currently in operation among the apparatuses 301 to 306.

Figure 7:
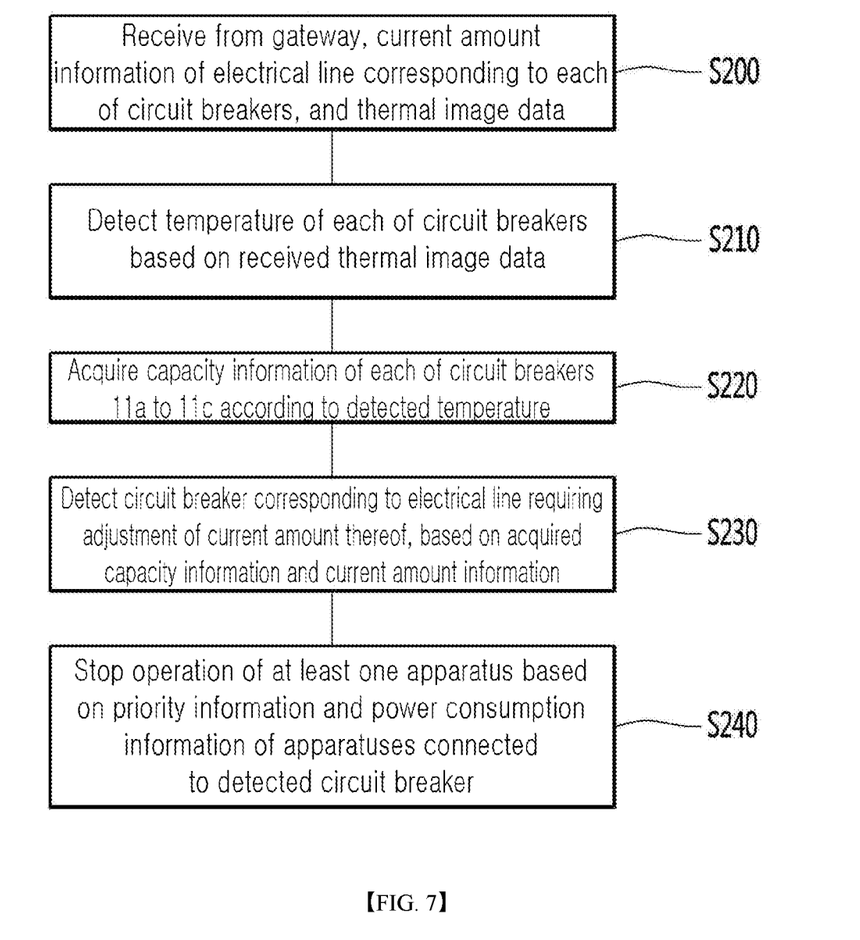
FIG. 7 is a flowchart for illustrating an operation of a load control device included in a switchboard-monitoring and load-controlling system according to another embodiment of the present disclosure.

FIG. 7 is a flowchart for illustrating an operation of the load control device included in the switchboard-monitoring and load-controlling system according to another embodiment of the present disclosure.

In the embodiment shown in FIG. 7, some of the operations performed by the gateway 100 in the above embodiments may be performed by the load control device 20. That is, Operation S100 to Operation S120 in the embodiment shown in FIG. 4 may be performed by the load control device 20 in this embodiment. In this case, the gateway 100 may perform only the transmission operation in which the gateway 100 transmits, to the load control device 20, the thermal image data received from the temperature sensor 13 and the current amount information acquired from the measuring units 12a to 12c. Further, in this case, the thermal image analysis information 121 and the circuit breaker temperature-capacity information 122 stored in the memory 120 of the gateway 100 may be stored in the memory 22 of the load control device 20.

Referring to FIG. 7, the load control device 20 may receive from the gateway 100, the current amount information of the electrical line corresponding to each of the circuit breakers 11a to 11c, and the thermal image data acquired by the temperature sensor 13 (Operation S200).

The load control device 20 may detect the temperature of each of the circuit breakers 11a to 11c based on the received thermal image data (Operation S210), and acquire the capacity information of each of the circuit breakers 11a to 11c according to the detected temperature (Operation S220).

The load control device 20 may detect a circuit breaker corresponding to an electrical line requiring adjustment of the current amount thereof, based on the acquired capacity information and current amount information (Operation S230).

Operations S210 to S230 may be substantially the same as Operation S100 to Operations S120 in FIG. 4, except that an execution subject thereof is changed from the gateway 100 to the load control device 20.

The load control device 20 may stop an operation of at least one apparatus based on the priority information and the power consumption information of the apparatuses connected to the detected circuit breaker (Operation S240).

According to the embodiments of the present disclosure, the switchboard-monitoring and load-controlling system may adjust the load based on the capacity varying according to the temperature of the circuit breaker, thereby to prevent unexpected cut-off of the electrical line.

Further, according to the present disclosure, the switchboard-monitoring and load-controlling system may stop operations of only some of the apparatuses based on the priority, thereby to effectively prevent unexpected stop of an operation of an apparatus having the high importance or requiring the continuous operation. Accordingly, an operator or a user may effectively manage the apparatuses existing in buildings or facilities via the switchboard-monitoring and load-controlling system.

The above descriptions are merely illustrative of the technical idea of the present disclosure. Those skilled in the art will be able to make various modifications and variations thereto without departing from the essential characteristics of the present disclosure. Therefore, the embodiments disclosed in the present disclosure are not intended to limit the technical idea of the present disclosure, but to illustrate the technical idea of the present disclosure. The scope of the technical idea of the present disclosure is not limited to these embodiments.

The scope of protection of the present disclosure should be interpreted by the claims below. All technical ideas within the equivalent scope to the claims should be interpreted as being included in the scope of the present disclosure.

What is claimed is:

1. A system for monitoring a switchboard and controlling a load, the system comprising:
    a gateway configured to:
        acquire temperature information of each of circuit breakers included in the switchboard, and current amount information of each of electrical lines corresponding to the circuit breakers;

acquire capacity information of each of the circuit breakers based on the acquired temperature information; and detect a circuit breaker corresponding to an electrical line requiring adjustment of a load thereof, based on the acquired capacity information and current amount information; and a load control device configured to stop an operation of at least one apparatus among apparatuses connected to the detected circuit breaker, thereby to adjust the load of the electrical line corresponding to the detected circuit breaker.

2. The system of claim 1, wherein the system further comprises a temperature sensor for acquiring data for acquiring temperature information of each of the circuit breakers included in the switchboard, wherein the gateway is configured to receive the data from the temperature sensor, and acquire the temperature information of each of the circuit breakers based on the received data.

3. The system of claim 2, wherein the temperature sensor includes a thermal image sensor to acquire thermal image data for each of the circuit breakers.

4. The system of claim 1, wherein the gateway is configured to receive the current amount information of each of the electrical lines corresponding to the circuit breakers from measuring units corresponding to the circuit breakers, respectively.

5. The system of claim 1, wherein the gateway has a memory, wherein circuit breaker temperature-capacity information including capacity information corresponding to temperature information of each of the circuit breakers is stored in the memory, wherein the gateway is configured to acquire the capacity information corresponding to the acquired temperature information, from the stored circuit breaker temperature-capacity information.

6. The system of claim 1, wherein the gateway is configured to:

detect a specific circuit breaker among the circuit breakers, wherein a current amount of an electrical line corresponding to the specific circuit breaker is greater than or equal to the acquired capacity; and transmit a load adjustment request to the load control device, wherein the load adjustment request includes identification information of the detected circuit breaker, the acquired capacity information thereof, and the current amount information of the electrical line corresponding to the detected circuit breaker.

7. The system of claim 1, wherein the gateway is configured to:

detect a specific circuit breaker among the circuit breakers, wherein a difference between the acquired capacity of the specific circuit breaker and the current amount of the electrical line corresponding thereto is smaller than a reference value; and transmit a load adjustment request to the load control device, wherein the load adjustment request includes identification information of the detected circuit breaker, the acquired capacity information thereof, and the current amount information of the electrical line corresponding to the detected circuit breaker.

8. The system of claim 1, wherein the load control device is configured to transmit a control signal indicating the stop of the operation to the at least one apparatus, based on priority information of the apparatuses connected to the detected circuit breaker, and power consumption information of each of the connected apparatuses.

9. The system of claim 8, wherein when the detected circuit breaker includes a first circuit breaker, and a second circuit breaker having a lower hierarchical level than a level of the first circuit breaker, the load control device is configured to stop an operation of at least one apparatus among a second group of apparatuses connected to the second circuit breaker, belonging to a first group of apparatuses connected to the first circuit breaker, thereby to adjust a load of a first electrical line corresponding to the first circuit breaker and a load of a second electrical line corresponding to the second circuit breaker.

10. The system of claim 9, wherein the load control device is configured to stop an operation of at least one apparatus among the first group of apparatuses connected to the first circuit breaker, based on changed current amount information of the first electrical line, and capacity information of the first circuit breaker, thereby to adjust the load of the first electrical line.

11. A system for monitoring a switchboard and controlling a load, the system comprising:

a temperature sensor for acquiring data for acquisition of temperature information of each of circuit breakers included in the switchboard;

a gateway configured to:
receive the data from the temperature sensor; and
receive current amount information of each of electrical lines corresponding to the circuit breakers from each of measuring units corresponding to the circuit breakers; and a load control device configured to:
receive the data and the current amount information from the gateway;
acquire temperature information of each of the circuit breakers based on the received data;
acquire capacity information of each of the circuit breakers based on the acquired temperature information;
detect a circuit breaker corresponding to an electrical line requiring adjustment of a load thereof, based on the acquired capacity information and current amount information; and
stop an operation of at least one apparatus among apparatuses connected to the detected circuit breaker, thereby to adjust the load of the electrical line corresponding to the detected circuit breaker.

12. The system of claim 11, wherein the load control device is configured to:

detect a specific circuit breaker among the circuit breakers, based on the acquired capacity information and current amount information, wherein a current amount of an electrical line corresponding to the specific circuit breaker is greater than or equal to the acquired capacity; and transmit a control signal indicating the stop of the operation to the at least one apparatus among the apparatus connected to the detected circuit breaker.

13. The system of claim 12, wherein the load control device is configured to transmit the control signal to the at least one apparatus, based on priority of the apparatuses connected to the detected circuit breaker, and power consumption of each of the connected apparatuses.

* * * * *